(12) United States Patent
Mou et al.

(10) Patent No.: US 10,473,956 B2
(45) Date of Patent: Nov. 12, 2019

(54) GLASSES WITH WEARING CUSHION DEVICE

(71) Applicant: Microjet Technology Co., Ltd., Hsinchu (TW)

(72) Inventors: Hao-Jan Mou, Hsinchu (TW); Ta-Wei Hsueh, Hsinchu (TW); Wei-Ming Lee, Hsinchu (TW); Chi-Feng Huang, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 55 days.

(21) Appl. No.: 15/941,369

(22) Filed: Mar. 30, 2018

(65) Prior Publication Data

US 2018/0292679 A1  Oct. 11, 2018

(30) Foreign Application Priority Data

Apr. 11, 2017 (TW) .............................. 106112088 A

(51) Int. Cl.
| | |
|---|---|
| G02C 5/12 | (2006.01) |
| G02C 11/00 | (2006.01) |
| G02C 5/14 | (2006.01) |
| G02C 5/16 | (2006.01) |
| F04B 49/02 | (2006.01) |
| F04B 49/03 | (2006.01) |

(Continued)

(52) U.S. Cl.
CPC .............. *G02C 11/10* (2013.01); *F04B 35/04* (2013.01); *F04B 39/14* (2013.01); *F04B 45/047* (2013.01); *F04B 49/02* (2013.01); *F04B 49/022* (2013.01); *F04B 49/03* (2013.01); *F04B 49/06* (2013.01); *F04B 49/08* (2013.01); *F04B 49/22* (2013.01); *F04B 51/00* (2013.01); *G02C 5/122* (2013.01); *G02C 5/143* (2013.01); *G02C 5/16* (2013.01); *F04B 2205/05* (2013.01); *G02C 5/126* (2013.01); *H01L 41/094* (2013.01)

(58) Field of Classification Search
CPC .................................. G02C 5/126; G02C 5/12
USPC ............................... 351/82, 136, 139, 78, 43
See application file for complete search history.

(56) References Cited

U.S. PATENT DOCUMENTS 5,191,363 A * 3/1993 Smith ..................... A61F 9/026
351/156

FOREIGN PATENT DOCUMENTS

| CN | 203953917 U | 11/2014 |
|---|---|---|
| CN | 205918569 U | 2/2017 |
| CN | 205982827 U | 2/2017 |

* cited by examiner

*Primary Examiner* — Hung X Dang
(74) *Attorney, Agent, or Firm* — Birch, Stewart, Kolasch & Birch, LLP

(57) ABSTRACT

A pair of glasses with a wearing cushion device comprises a main body, an inflatable cushion system, an air pump, a switch element, a control unit and an air channel. The inflatable cushion system comprises two supporting cushions and two buffer cushions. When the switch element is turned on, the switch element issues an enabling signal to the control unit and the control unit enables the air pump in response to the enabling signal. When the air pump is enabled, an ambient gas is transferred to the two supporting cushions and the two buffer cushions through the air channel. The two supporting cushions and the two buffer cushions are inflated with the gas and expanded, so as to fit closely on the ears of the user by the two buffer cushions, and fit closely on the bridge of the nose of the user by the supporting cushions.

15 Claims, 11 Drawing Sheets

(51) Int. Cl.
*F04B 45/047* (2006.01)
*F04B 51/00* (2006.01)
*F04B 35/04* (2006.01)
*F04B 39/14* (2006.01)
*F04B 49/06* (2006.01)
*F04B 49/08* (2006.01)
*F04B 49/22* (2006.01)
*H01L 41/09* (2006.01)

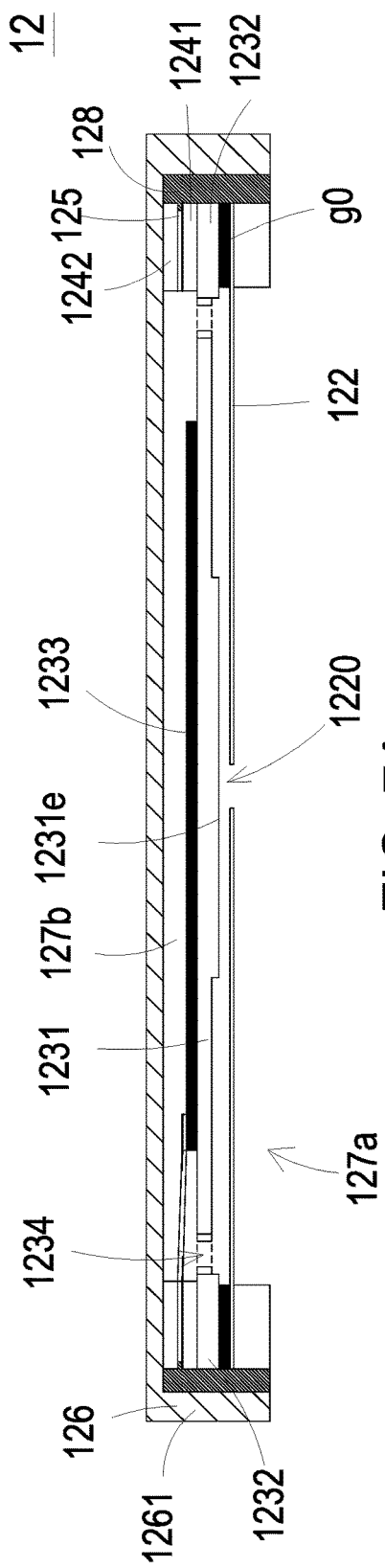
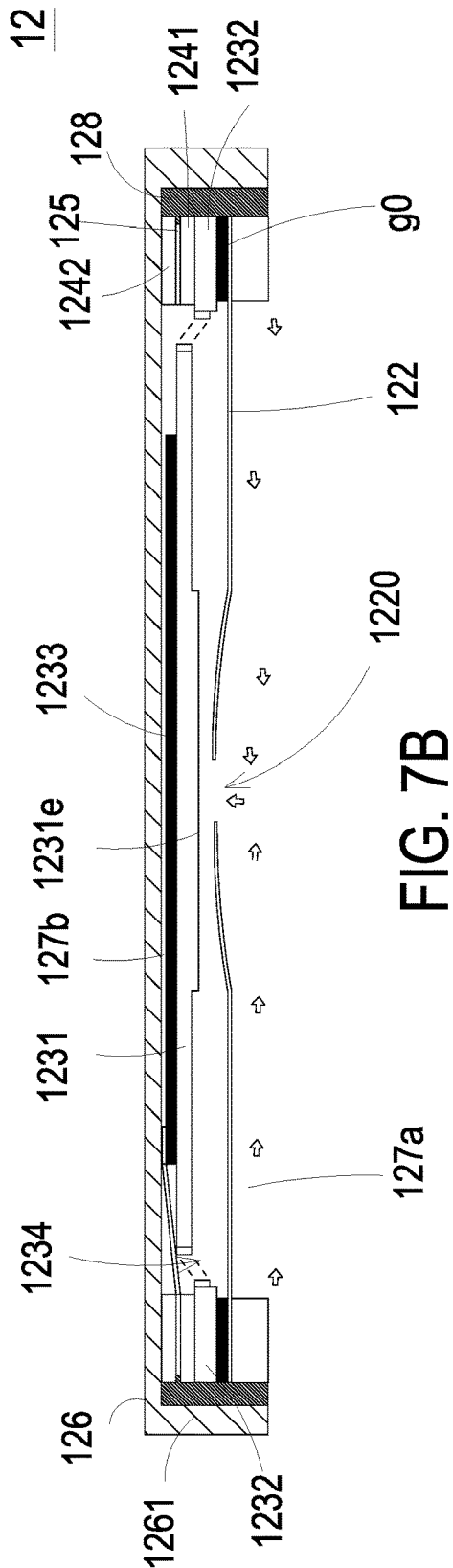
FIG. 7A
FIG. 7B

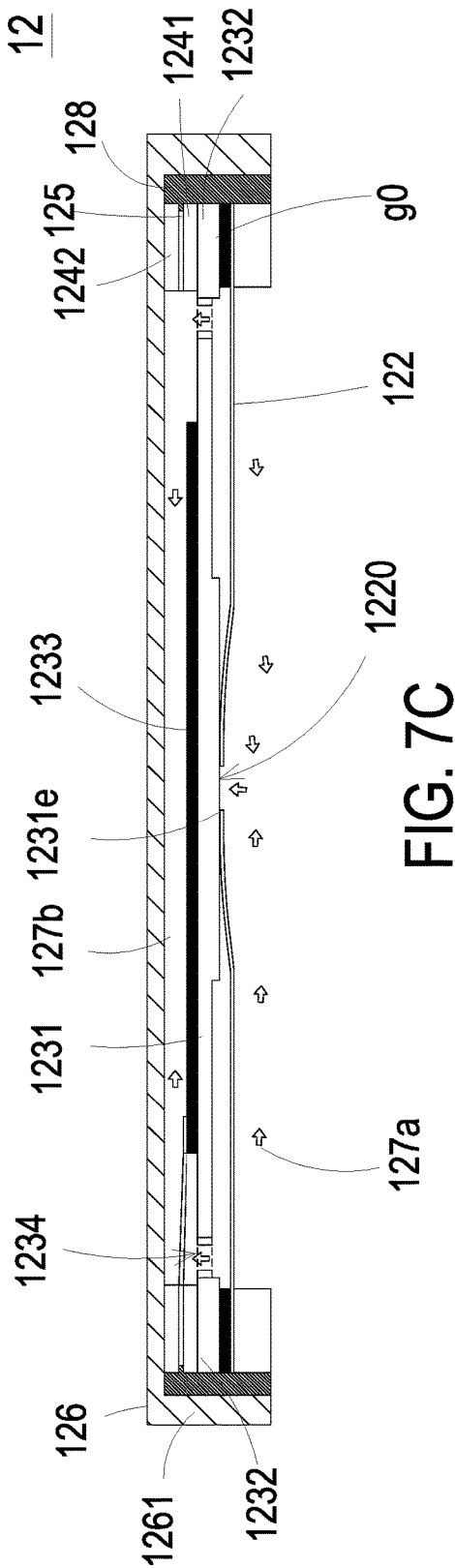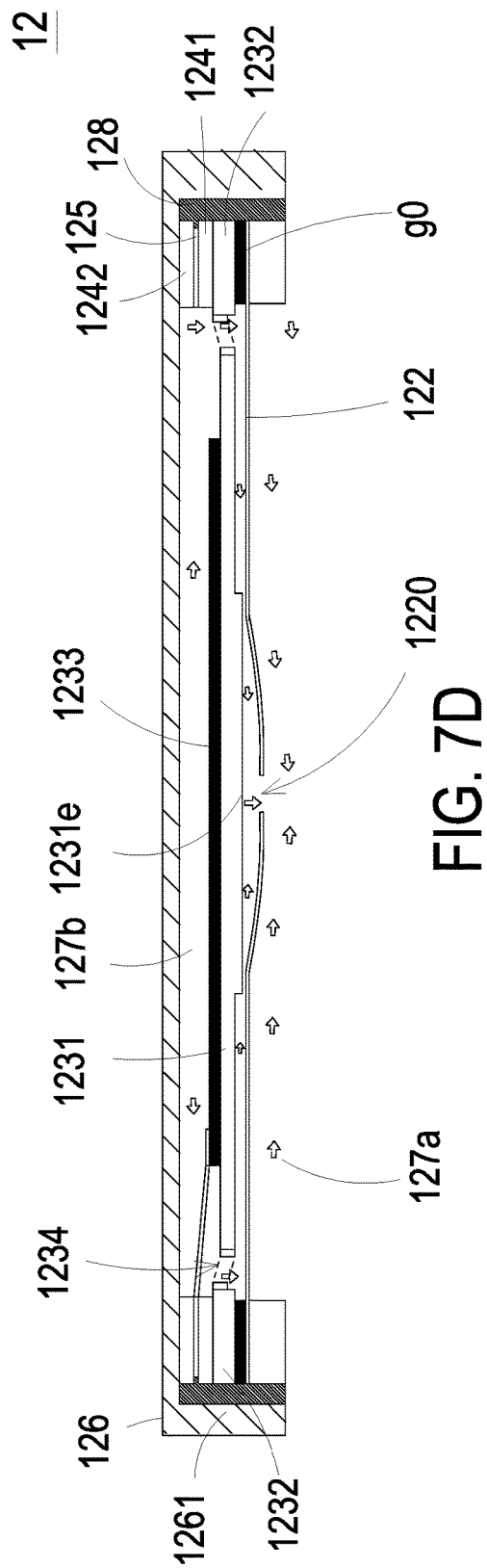

GLASSES WITH WEARING CUSHION DEVICE

FIELD OF THE INVENTION

The present invention relates to a pair of glasses, and more particularly to a pair of glasses with a wearing cushion device inflated by an air pump.

BACKGROUND OF THE INVENTION

With increasing development of science and technology, various 3C products are introduced into the market. Since the demands of modern people on the 3C products become higher and higher, the burdens on people's eyesight are heavier. As a result, the average age that people start needing to wear glasses is lowering, and the population wearing glasses is increasing. Thus, the manufacturers pay attention to the improvement of the aesthetically-pleasing appearance and the wearing comfort of the glasses.

Generally, the temples of the commercially available glasses are one-piece plastic structures, or the temples are metal bracket with plastic material earmuffs. That is, the parts of the temples contacting the ears are made of the plastic material. Since the plastic material is a hard material, the ears are uncomfortable when the glasses are worn. Moreover, the temples of the commercially available glasses cannot completely match the shapes of the user's ears. Under this circumstance, the glasses may fall down from the ears readily, thus damaging the glasses or causing danger if the user is taking exercise or driving.

Currently, some kinds of silicone hooks are commercially available. The silicone hooks are for being sheathed around the rear parts of the temples. When the glasses are worn by the user, the user's ears are hooked by the silicone hooks and thus the possibility of falling down the glasses is reduced. However, the process of sheathing the silicone hooks around the temples is troublesome. Moreover, because of the silicone hooks, it is more difficult to put on and take off the glasses. In addition, the silicone hooks also cannot completely match the shapes of the user's ears. That is, the silicone hooks result in foreign body sensation. Consequently, the overall comfort of wearing the glasses is impaired.

In addition, when the conventional glasses are worn, they need to be attached to the bridge of the nose through two cushions to support the glasses to hang on the face. The cushions are not only for supporting the glasses, but also for keeping a specific distance between the eyes and the glasses to perform a correct focusing position of the glasses. The cushion is assembled on the glasses by a slightly shiftable arrangement, so as to adopt a preferable contacting position of wearing on the bridge of the nose. However, the design that can slightly shift the cushion cannot completely affix to the bridge of the nose. If the nose produces oil, it will cause the cushion to slide down, thereby affecting the focusing position of the glasses. The wearer often needs to push the glasses upwards to move to the correct focusing position of the glasses, which result in inconvenience. Moreover, the cushions currently available on the market are all mass-produced products; it is difficult to respond to the wearer's ears or nose, causing discomfort to the wearer, and it is necessary to be improved.

Therefore, there is a need of providing a pair of glasses with a wearing cushion device in order to increase the wearing comfort and to adjust the correct focusing position.

SUMMARY OF THE INVENTION

An object of the present invention provides a pair of glasses with a wearing cushion device, through the design of the supporting cushions and the buffer cushions both of which can be inflated with gas, an inflatable cushion system thereby fit on the bridge of the nose and the ears of the user, and the position and the height of the glasses are adjusted to provide comfortable wearing experience, resolving the problems with conventional glasses in which the ears feel uncomfortable and the glasses easily fall off while wearing.

In accordance with an aspect of the present invention, there is provided a pair of glasses with a wearing cushion device. The glasses comprise a main body, two buffer cushions, two supporting cushions, an air pump, a switch element, a control unit and an air channel. The main body comprises a frame and two legs. The two buffer cushions are respectively disposed on the two legs. The two supporting cushions are disposed on the frame of the main body and corresponding to the bridge of the nose. The air pump is in communication with the two buffer cushions and two supporting cushions. The control unit is electrically connected with the switch element and the air pump. The air channel is in communication with the two supporting cushions, the two buffer cushions and the air pump. When the switch element is turned on, the switch element issues an enabling signal to the control unit and the control unit enables the air pump in response to the enabling signal. When the air pump is enabled, an ambient gas is transferred to the two supporting cushions and the two buffer cushions through the air channel. The two supporting cushions and the two buffer cushions are inflated with the gas and expanded.

The above contents of the present invention will become more readily apparent to those ordinarily skilled in the art after reviewing the following detailed description and accompanying drawings, in which:

BRIEF DESCRIPTION OF THE DRAWINGS

FIGS. 7A to 7D schematically illustrate the actions of the air pump according to the first embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
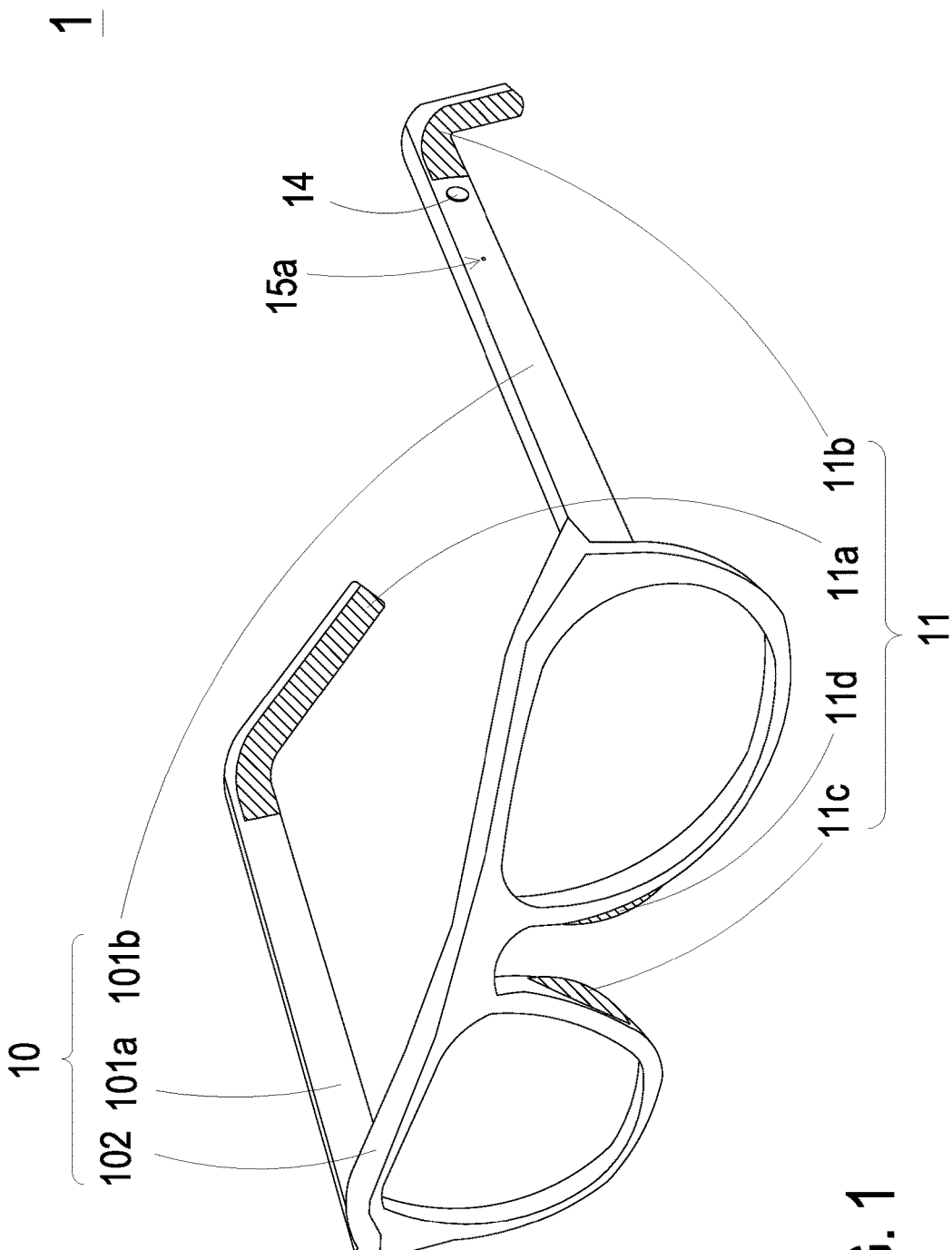
FIG. 1 is a schematic perspective view illustrating the outer appearance of a pair of glasses with a wearing cushion device according to a first embodiment of the present invention.

FIG. 1 is a schematic perspective view illustrating the outer appearance of a pair of glasses with a wearing cushion device according to a first embodiment of the present invention. As shown in FIG. 1, the glasses 1 comprise a main body 10, an inflatable cushion system 11 and a switch element 14. The inflatable cushion system 11 comprises two buffer cushions 11a, 11b and two supporting cushions 11c, 11d. The main body 10 comprises two legs 101a, 101b and a frame 102. The two legs 101a, 101b are connected to the two ends of the frame 102, respectively. The two legs 101a, 101b are foldable, but not limited thereto. The two buffer cushions 11a, 11b are covered on a portion of a surface of the two legs 101a, 101b, respectively. The two supporting cushions 11c, 11d are disposed on the frame 102 of the main body 10 and corresponding to the bridge of the nose. The two supporting cushions 11c, 11d are for the glasses 1 fitting closely on the bridge of the nose of the user, and the position and the height of the main body 10 are adjusted to provide comfortable and convenient wearing experience to the user. Preferably but not exclusively, the buffer cushions 11a, 11b and the supporting cushions 11c, 11d are one-piece expandable structures. Moreover, the outer shells of the buffer cushions 11a, 11b and the supporting cushions 11c, 11d are made of a compressible elastic material, which can be expanded or compact. For example, the compressible elastic material includes but is not limited to a silicone material. The switch element 14 is located at the leg 101b of the main body 10. For example, the switch element 14 is a button, but not limited thereto.

Figure 2A:
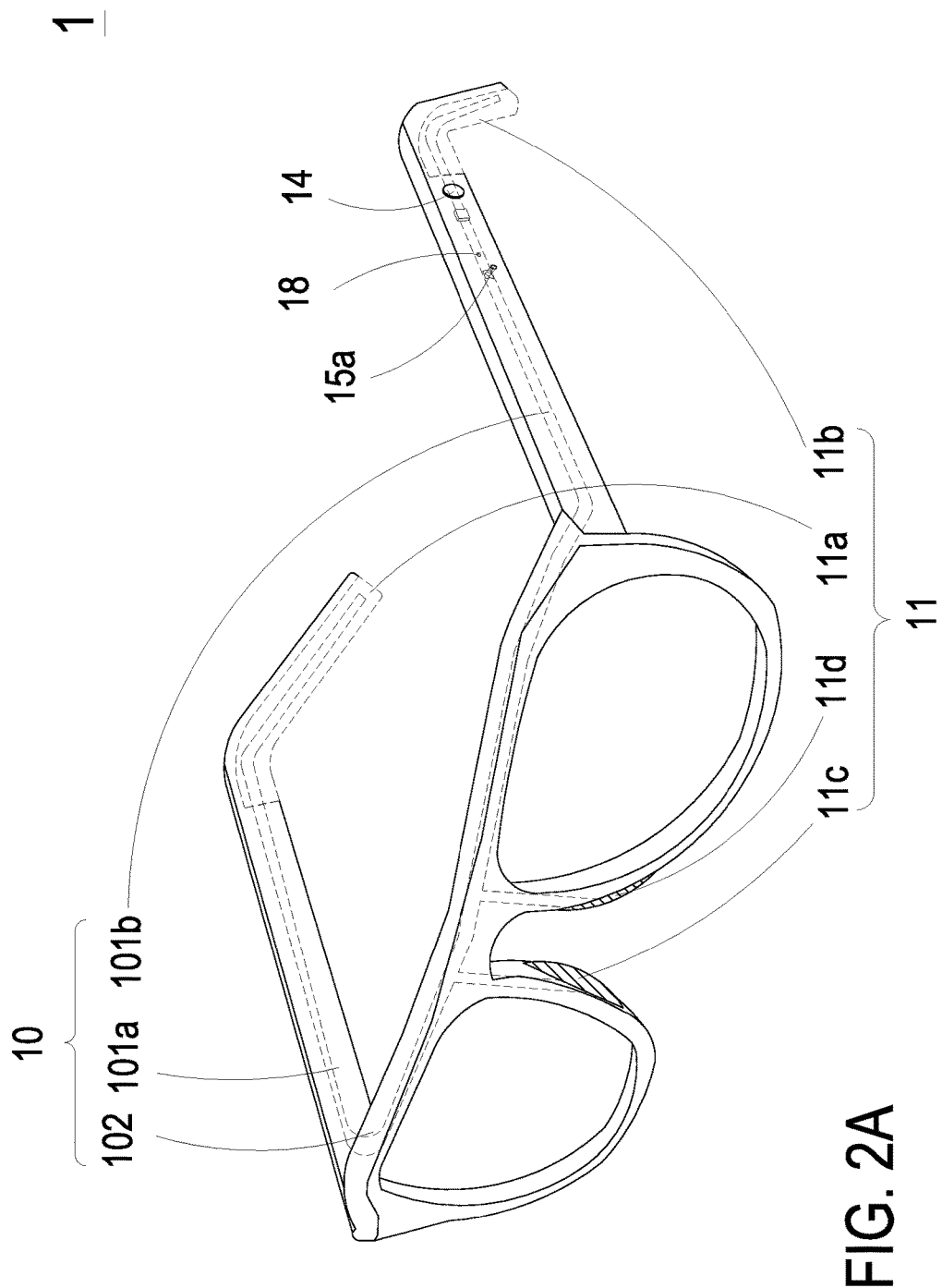
FIG. 2A is a schematic perspective view illustrating the inner portion of the glasses according to the first embodiment of the present invention.
Figure 2B:
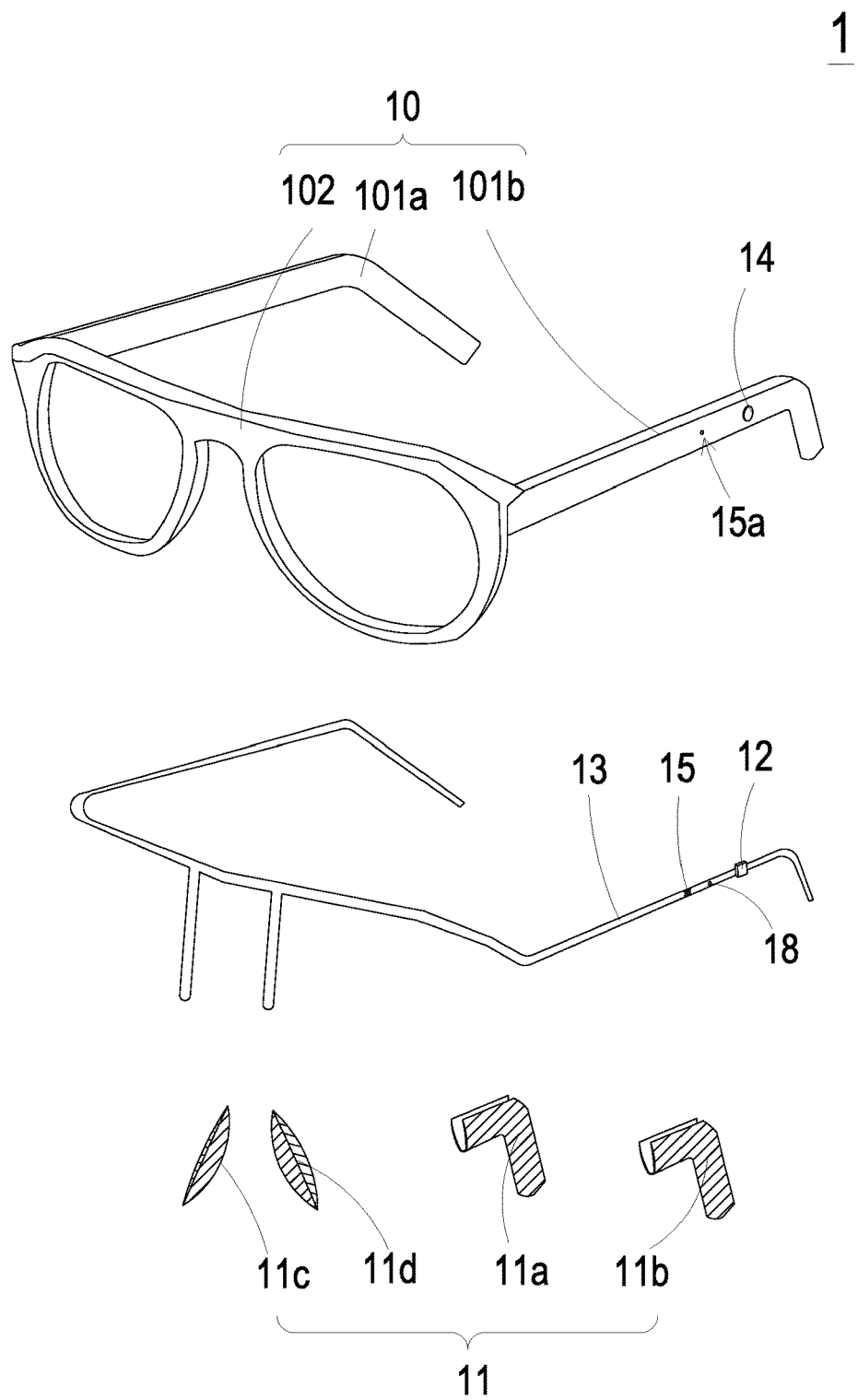
FIG. 2B is a schematic exploded view illustrating the glasses according to the first embodiment of the present invention.

Please refer to FIGS. 2A and 2B. FIG. 2A is a schematic perspective view illustrating the inner portion of the glasses according to the first embodiment of the present invention. FIG. 2B is a schematic exploded view illustrating the glasses according to the first embodiment of the present invention. In this embodiment, the glasses 1 further comprise an air pump 12 and an air channel 13. The air channel 13 is a soft hollow tube for communicating gas. In this embodiment, the air channel 13 is embedded within the main body 10, but not limited thereto. The air channel 13 is in communication with the buffer cushions 11a, 11b sheathing on the ends of the two legs 101a, 101b and the supporting cushions 11c, 11d disposed on the frame 102. The air pump 12 is also in communication with the air channel 13, so that the air pump 12 can introduce the gas into the air channel 13.

In an embodiment, the buffer cushions 11a, 11b and the supporting cushions 11c, 11d have a first inflating hole (not shown) and a second inflating hole (not shown), respectively. Meanwhile, the air channel 13 comprises a first channel opening (not shown) corresponding to the first inflating hole and a second channel opening (not shown) corresponding to the second inflating hole. The size and location of the first channel opening match those of the first inflating hole, and the size and location of the second channel opening match those of the second inflating hole. As a result, the first channel opening can be connected to the first inflating hole to communicate gas between the air channel 13 and the buffer cushions 11a, 11b. Similarly, the second channel opening can be connected to the second inflating hole to communicate gas between the air channel 13 and the supporting cushions 11c, 11d.

Figure 3:
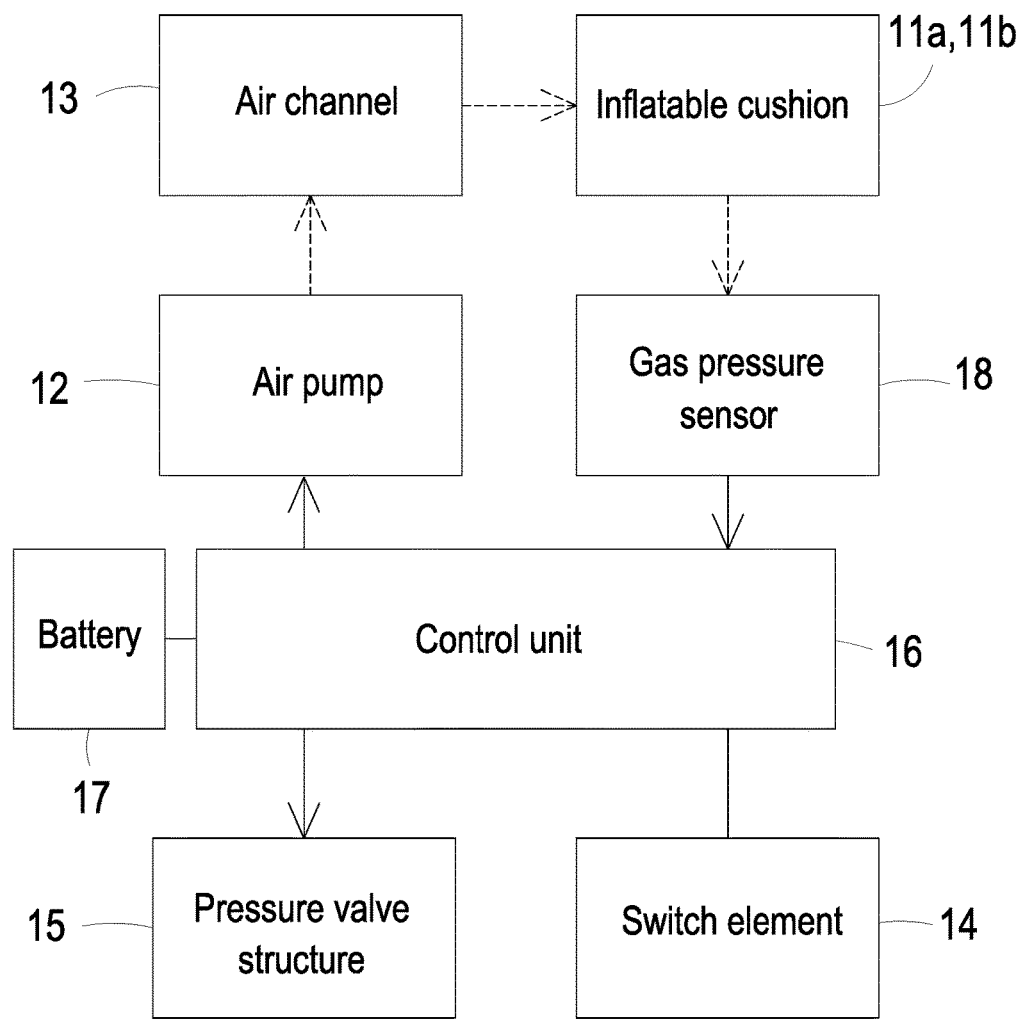
FIG. 3 is a schematic functional block diagram illustrating the architecture of the glasses according to the first embodiment of the present invention.

Please refer to FIGS. 2A, 2B and 3. FIG. 3 is a schematic functional block diagram illustrating the architecture of the glasses according to the first embodiment of the present invention. In this embodiment, the glasses 1 further comprise a control unit 16 and a battery 17. The battery 17 provides electric power for powering the control unit 16. The control unit 16 is electrically connected with the air pump 12 and the switch element 14 for receiving signals from the switch element 14 and accordingly controlling the air pump 12. When the glasses 1 are worn by the user, the supporting cushions 11c, 11d are contacted with the bridge of the nose of the user, and the buffer cushions 11a, 11b are contacted with the ears and the face of the user. When the switch element 14 is turned on, the switch element 14 issues an enabling signal to the control unit 16. In response to the enabling signal, the control unit 16 enables the air pump 12 to transfer the gas into the buffer cushions 11a, 11b and the supporting cushions 11c, 11d through the air channel 13. Being inflated with the gas, the supporting cushions 11c, 11d expand to fit the shape of the bridge of the nose of the user, and provide a supporting force to support the frame 102, so as to adjust the position and the height of the main body 10. Meanwhile, the buffer cushions 11a, 11b are also expanded to fit the shape of the ears and the face of the user, where the portion disposed on the legs 101a, 101b can be provided as a buffer zone for enhancing comfort of wearing the glasses 1. Moreover, as a result, the glasses 1 is securely worn on the user's ears, face and the bridge of the nose, and does not easily fall off, which is more safe and comfortable than conventional ones.

Please refer to FIG. 3 again. In this embodiment, the glasses 1 further comprise a gas pressure sensor 18. The gas pressure sensor 18 is electrically connected with the control unit 16 and in communication with the air channel 13 for sensing the pressure of the gas in the air channel 13. The gas pressure sensor 18 may be embedded within the main body 10. If the gas pressure sensor 18 detects that the pressure of the gas within the buffer cushions 11a, 11b and the supporting cushions 11c, 11d is higher than a threshold value, the gas pressure sensor 18 issues a disabling signal to the control unit 16. In response to the disabling signal, the control unit 16 disables the air pump 12. Consequently, the pressure of the gas within the buffer cushions 11a, 11b and the supporting cushions 11c, 11d are adjusted to be in a specified range, so that the buffer cushions 11a, 11b and the supporting cushions 11c, 11d are prevented from being excessively expanded and the pressure applied to ears, face and the bridge of nose of the user is comfortable.

Please refer to FIGS. 1, 2A, 2B and 3 again. In this embodiment, the glasses 1 further comprise a pressure valve structure 15. The pressure valve structure 15 is embedded within the main body 10, but not limited thereto. The pressure valve structure 15 is in communication with the air channel 13. Meanwhile, the pressure valve structure 15 is in communication with the exterior of the glasses 1 through an exhaust hole 15a of the main body 10. The pressure valve structure 15 is a switchable valve structure comprising a check valve (not shown) and a relief valve (not shown). The check valve allows the gas in the air channel 13 to flow in only one direction without backflow. The relief valve is used for adjusting the pressure of the air channel 13.

The pressure valve structure 15 is electrically connected with the control unit 16. When the air pump 12 is enabled by the control unit 16 in response to the enabling signal, the control unit 16 controls the check valve of the pressure valve structure 15 to act, so that the gas is transferred through the air channel 13 in one direction without backflow. When the switch element 14 issues a pressure-relief signal to the control unit 16, the control unit 16 controls the relief valve of the pressure valve 15 to decrease the pressure, so that the gas is exhausted from the buffer cushions 11a, 11b and the supporting cushions 11c, 11d to the surroundings through the air channel 13, the pressure valve structure 15 and the exhaust hole 15a, sequentially. Consequently, the pressure in the air channel 13 is properly adjusted, or the buffer cushions 11a, 11b and the supporting cushions 11c, 11d are restored to the deflated state. The user can deflate the buffer cushions 11a, 11b and the supporting cushions 11c, 11d or decrease the pressure thereof before putting the glasses in the non-usage state. Therefore, since the buffer cushions 11a, 11b and the supporting cushions 11c, 11d are not continuously in the high pressure state, the use lives of the buffer cushions 11a, 11b and the supporting cushions 11c, 11d are extended.

Figure 4A:
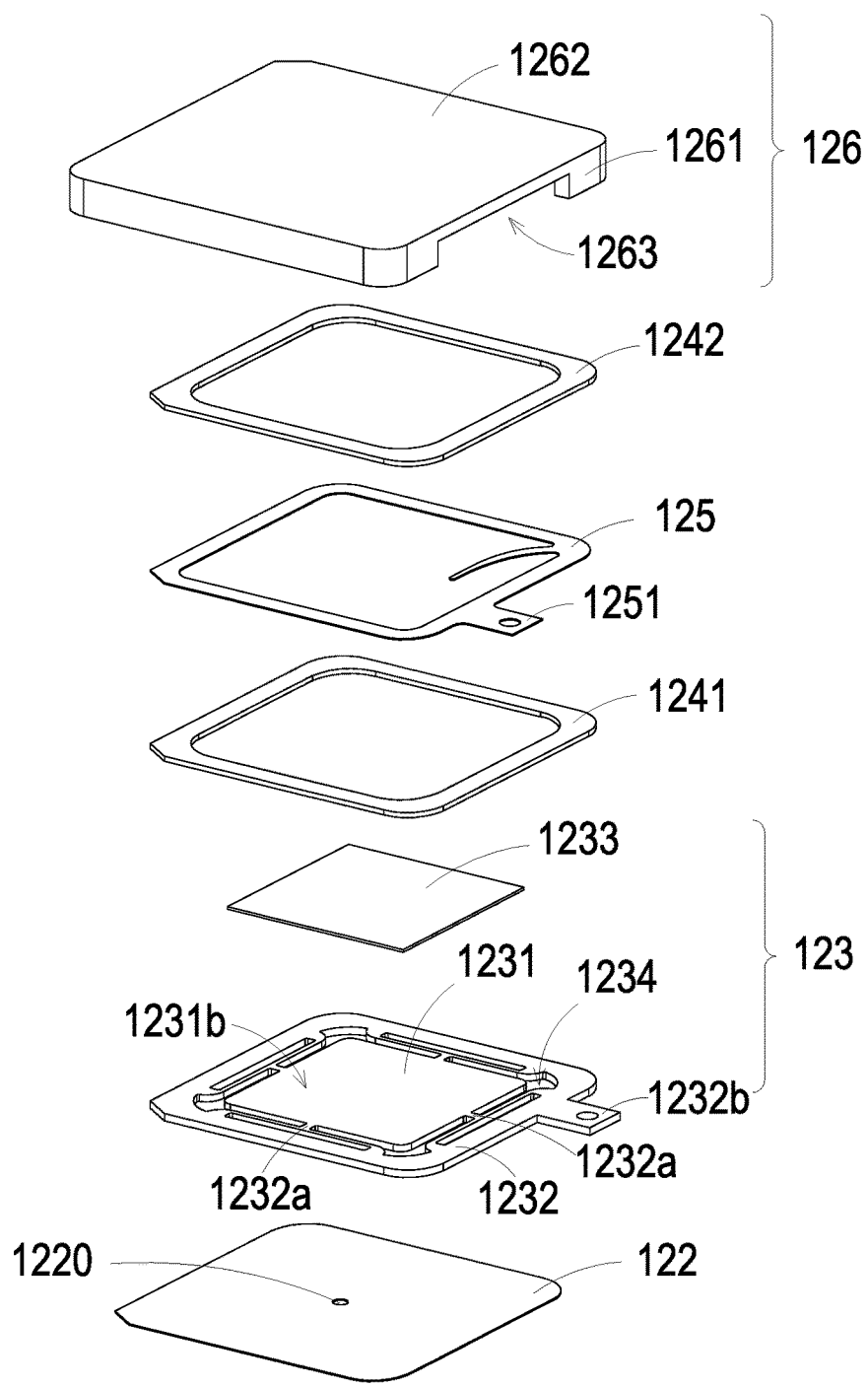
FIG. 4A is a schematic exploded view illustrating the air pump of the glasses according to the first embodiment of the present invention and taken along a front side.
Figure 4B:
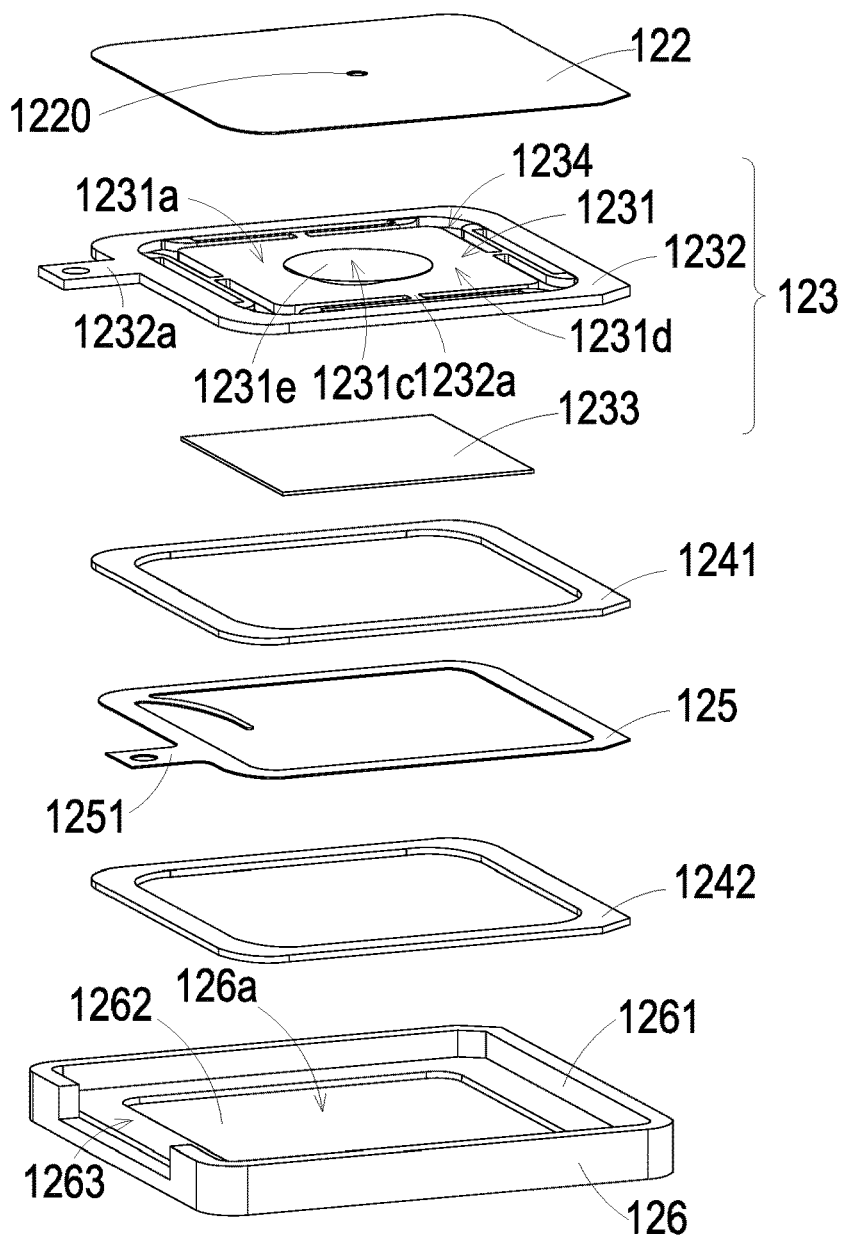
FIG. 4B is a schematic exploded view illustrating the air pump of the glasses according to the first embodiment of the present invention and taken along a rear side.

FIG. 4A is a schematic exploded view illustrating the air pump of the glasses according to the first embodiment of the present invention and taken along a front side. FIG. 4B is a schematic exploded view illustrating the air pump of the glasses according to the first embodiment of the present invention and taken along a rear side.

In an embodiment, the air pump 12 is a piezoelectric air pump for driving the gas. In this embodiment, the air pump 12 comprises a resonance plate 122, a piezoelectric actuator 123 and a covering member 126.

The resonance plate 122 is aligned with the piezoelectric actuator 123. The resonance plate 122 comprises a central aperture 1220. The central aperture 1220 is formed in a middle portion of the resonance plate 122.

The piezoelectric actuator 123 comprises a suspension plate 1231, an outer frame 1232 and a piezoelectric element 1233. Preferably but not exclusively, the suspension plate 1231 is a square suspension plate. The suspension plate 1231 comprises a middle portion 1231c and a periphery portion 1231d. When the piezoelectric element 1233 is subjected to the curvy vibration in response to an applied voltage, the suspension plate 1231 is subjected to the curvy vibration from the middle portion 1231c to the periphery portion 1231d. The outer frame 1232 is arranged around the suspension plate 1231 and comprises at least one bracket 1232a and at least one conducting pin 1232b. Each of the at least one bracket 1232a is arranged between the suspension plate 1231 and the outer frame 1232. The two ends of the bracket 1232a are connected with the suspension plate 1231 and the outer frame 1232, respectively. Consequently, the bracket 1232a can elastically support the suspension plate 1231. The conducting pin 1232b is protruded outwardly from the outer frame 1232 so as to be electrically connected with an external power source (not shown). The piezoelectric element 1233 is attached on a second surface 1231b of the suspension plate 1231. The length of a side of the piezoelectric element 1233 is smaller than or equal to the length of a side of the suspension plate 1231, but not limited herein. When the piezoelectric element 1233 is subjected to deformation in response to an applied voltage, the suspension plate 1231 is subjected to a curvy vibration.

The covering member 126 comprises a sidewall 1261, a bottom plate 1262 and an opening 1263. The sidewall 1261 is protruded from the edges of the bottom plate 1262. Moreover, an accommodation space 126a is defined by the sidewall 1261 and the bottom plate 1262 collaboratively. The resonance plate 122 and the piezoelectric actuator 123 are accommodated within the accommodation space 126a. The opening 1263 is formed in the sidewall 1261. The conducting pin 1232b of the outer frame 1232 is protruded out of the covering member 126 through the opening 1263 so as to be electrically connected with an external circuit (not shown), but not limited herein.

The air pump 12 further comprises a first insulation plate 1241, a conducting plate 125 and a second insulation plate 1242. The first insulation plate 1241 is located over the conducting plate 125. The second insulation plate 1242 is located under the conducting plate 125. The shapes of the first insulation plate 1241 and the second insulation plate 1242 substantially match the shape of the outer frame 1232 of the piezoelectric actuator 123. The first insulation plate 1241 and the second insulation plate 1242 are made of an insulating material (e.g. a plastic material) for providing insulating efficacy. The conducting plate 125 is made of an electrically conductive material (e.g. a metallic material) for providing electrically conducting efficacy. The shape of the conducting plate 125 substantially matches the shape of the outer frame 1232 of the piezoelectric actuator 123. Moreover, the conducting plate 125 has a conducting pin 1251 so as to be electrically connected with an external circuit (not shown). Similarly, the conducting pin 1251 is protruded out of the covering member 126 through the opening 1263 so as to be electrically connected with the control unit 16.

Figure 5A:
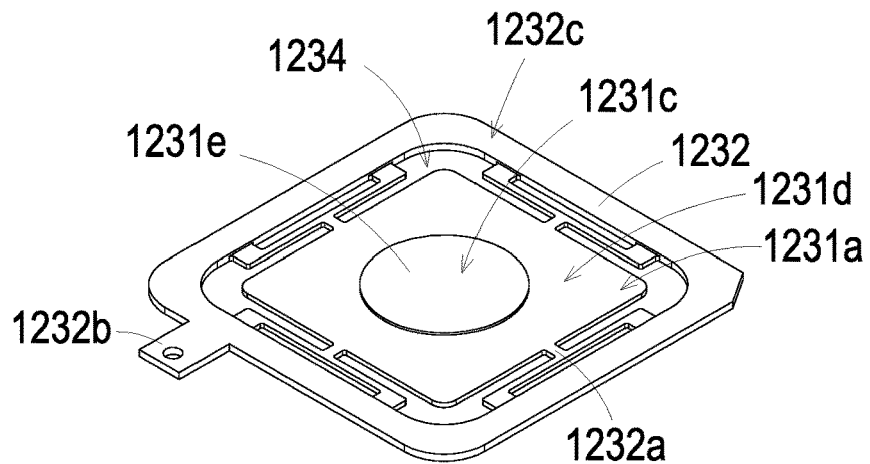
FIG. 5A is a schematic perspective view illustrating the piezoelectric actuator of the air pump according to the first embodiment of the present invention and taken along the front side.
Figure 5B:
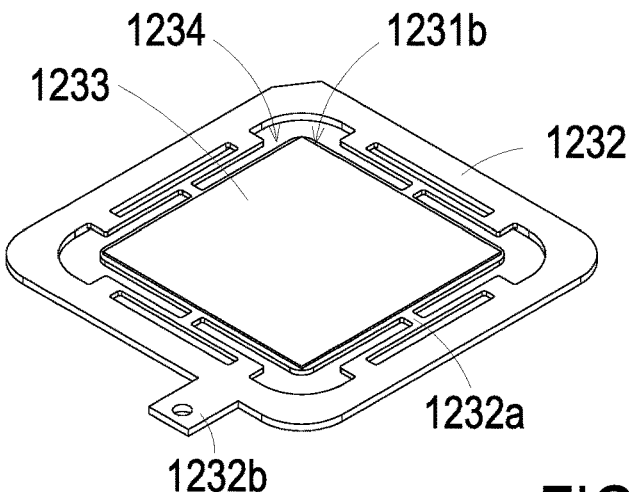
FIG. 5B is a schematic perspective view illustrating the piezoelectric actuator of the air pump according to the first embodiment of the present invention and taken along the rear side.
Figure 5C:
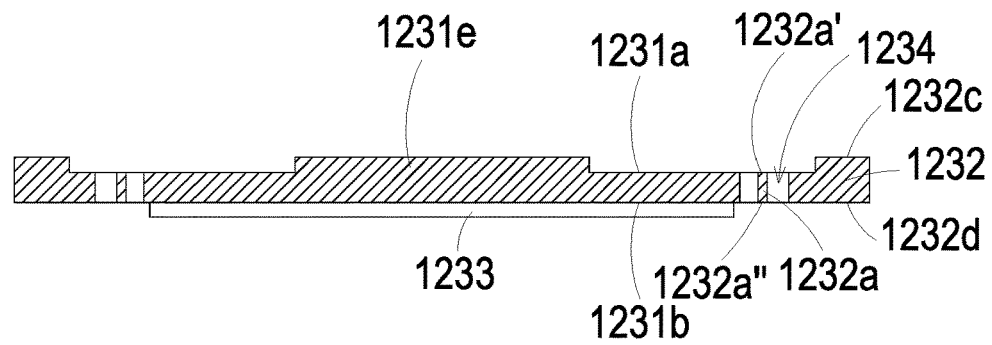
FIG. 5C is a schematic cross-sectional view illustrating the piezoelectric actuator of the air pump according to the first embodiment of the present invention.

FIG. 5A is a schematic perspective view illustrating the piezoelectric actuator of the air pump according to the first embodiment of the present invention and taken along the front side. FIG. 5B is a schematic perspective view illustrating the piezoelectric actuator of the air pump according to the first embodiment of the present invention and taken along the rear side. FIG. 5C is a schematic cross-sectional view illustrating the piezoelectric actuator of the air pump according to the first embodiment of the present invention.

In this embodiment, the suspension plate 1231 is a stepped structure. That is, the suspension plate 1231 comprises a bulge 1231e. The bulge 1231e is formed on the first surface 1231a of the suspension plate 1231 and located at the middle portion 1231c. For example, the bulge 1231e is a circular convex structure such as a cylinder. In some embodiments, the suspension plate 1231 is a square plate structure with two flat surfaces without the bulge 1231e.

Please refer to FIG. 5C again. A top surface of the bulge 1231e of the suspension plate 1231 is coplanar with a first surface 1232c of the outer frame 1232, and the first surface 1231a of the suspension plate 1231 is coplanar with a first surface 1232a' of the bracket 1232a. Moreover, the bulge 1231e of the suspension plate 1231 (or the first surface 1232c of the outer frame 1232) has a specified thickness with respect to the first surface 1231a of the suspension plate 1231 (or the first surface 1232a' of the bracket 1232a). A second surface 1231b of the suspension plate 1231, a second surface 1232d of the outer frame 1232 and a second surface 1232a" of the bracket 1232a are coplanar with each other.

The piezoelectric element 1233 is attached on the second surface 1231*b* of the suspension plate 1231. In some other embodiments, the suspension plate 1231 is a square plate structure with two flat surfaces. That is, the structure of the suspension plate 1231 may be varied according to the practical requirements. In this embodiment, the suspension plate 1231, the outer frame 1232 and the at least bracket 1232*a* are integrally formed and produced by using a metal plate (e.g., a stainless steel plate). Moreover, at least one vacant space 1234 is formed between the suspension plate 1231, the outer frame 1232 and the bracket 1232*a* for allowing the gas to go through.

Figure 6:
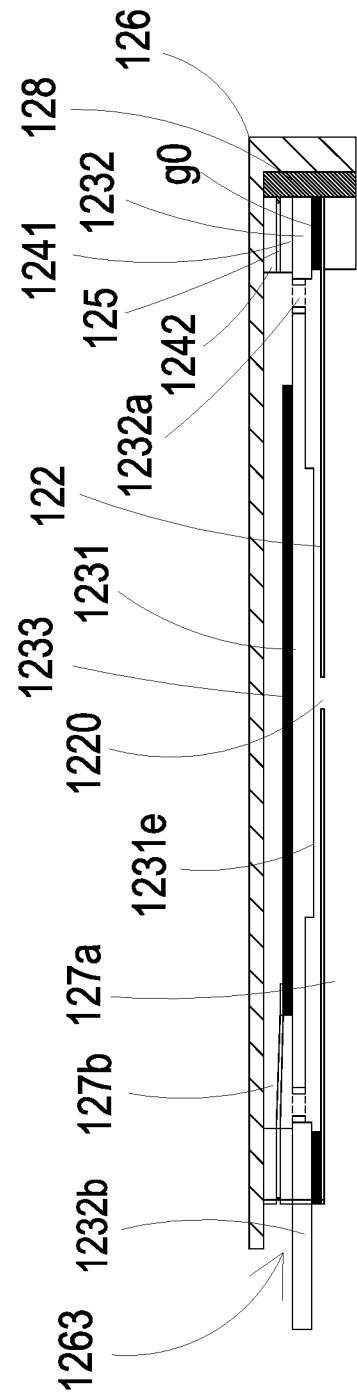
FIG. 6 is a schematic cross-sectional view illustrating the air pump of FIGS. 4A and 4B.

The inner structure and the outer structure of the air pump 12 will be described as follows. FIG. 6 is a schematic cross-sectional view illustrating the air pump of FIGS. 4A and 4B. From top to bottom, the covering member 126, the second insulation plate 1242, the conducting plate 125, the first insulation plate 1241, the piezoelectric actuator 123 and the resonance plate 122 of the air pump 12 are stacked on each other sequentially, wherein the peripheries of the piezoelectric actuator 123, the first insulation plate 1241, the conducting plate 125 and the second insulation plate 1242 are coated with glue to form a glue layer 128. The glue layer 128 is filled in the accommodation space 126*a* of the covering member 126 and seals the peripheries of the components. Consequently, the air pump 12 is assembled.

The air pump 12 has a square profile. It is noted that the profile of the air pump 12 may be varied according to the practical requirements. Moreover, the conducting pin 1251 (not shown) of the conducting plate 125 and the conducting pin 1232*b* of the piezoelectric actuator 123 are protruded out of the covering member 126 so as to be electrically connected with an external circuit. After the air pump 12 is assembled, a first chamber 127*b* is formed between the covering member 126 and the resonance plate 122. Moreover, a convergence chamber 127*a* is defined by the sidewall 1261 of the covering member 126 and the resonance plate 122 collaboratively.

In this embodiment, there is a gap g0 between the resonance plate 122 and the piezoelectric actuator 123. Moreover, a filler (e.g. a conductive adhesive) is inserted into the gap g0. Consequently, the depth of the gap g0 between the resonance plate 122 and the bulge 1231*e* of the suspension plate 1231 can be maintained to guide the gas to flow more quickly. Moreover, due to the proper distance between bulge 1231*e* of the suspension plate 1231 and the resonance plate 122, the contact interference is reduced and the generated noise is largely reduced. In some embodiments, the height of the outer frame 1232 of the piezoelectric actuator 123 is increased, so that the gap is formed between the resonance plate 122 and the piezoelectric actuator 123.

When the piezoelectric actuator 123 is actuated to perform a gas-collecting operation, the gas is introduced into the convergence chamber 127*a* through the opening 1263 of the covering member 126, transferred to the first chamber 127*b* through the central aperture 1220 of the resonance plate 122, and temporarily stored in the first chamber 127*b*. When the piezoelectric actuator 123 is actuated to perform a gas-releasing operation, the gas is transferred from the first chamber 127*b* to the convergence chamber 127*a* through the central aperture 1220 of the resonance plate 122 and transferred to the air channel 13 through the pressure valve structure 15.

The operations of the air pump 12 will be described as follows. FIGS. 7A to 7D schematically illustrate the actions of the air pump according to the first embodiment of the present invention.

Please refer to FIG. 7A, which shows an initial state of the air pump not in action. After the covering member 126, the second insulation plate 1242, the conducting plate 125, the first insulation plate 1241, the piezoelectric actuator 123 and the resonance plate 122 of the air pump 12 are stacked on each other sequentially, the air pump 12 is assembled. There is a gap g0 between the resonance plate 122 and the piezoelectric actuator 123. The convergence chamber 127*a* is defined by the sidewall 1261 of the covering member 126, the resonance plate 122 and the bottom surface 201*a* of the receiving part 201 collaboratively. The first chamber 127*b* is formed between the covering member 126 and the resonance plate 122.

Please refer to FIG. 7B. When the piezoelectric actuator 123 of the air pump 12 is actuated, the piezoelectric actuator 123 is vibrated upwardly in response to the applied voltage. Consequently, the ambient gas is introduced into the air pump 12 through the opening 1263 of the covering member 126. After the gas is converged to the convergence chamber 127*a*, the gas is transferred to the first chamber 127*b* through the central aperture 1220 of the resonance plate 122. Due to the resonance effect of the suspension plate 1231 of the piezoelectric actuator 123, the resonance plate 122 is vibrated in a reciprocating manner. That is, the resonance plate 122 is subjected to an upward deformation. Meanwhile, the position of the resonance plate 122 corresponding to the central aperture 1220 is protruded upwardly.

Please refer to FIG. 7C. The piezoelectric actuator 123 is vibrated downwardly and has returned to its original position. Meanwhile, the bulge 1231*e* of the suspension plate 1231 of the piezoelectric actuator 123 is close to the central aperture 1220 of the resonance plate 122. Consequently, the gas in the air pump 12 is transferred to and temporarily stored in the upper portion of the first chamber 127*b*.

Please refer to FIG. 7D. The piezoelectric actuator 123 is vibrated downwardly. Due to the resonance effect of the piezoelectric actuator 123, the resonance plate 122 is vibrated downwardly. Due to the downward deformation of the resonance plate 122, the volume of the first chamber 127*b* is shrunken. Consequently, the gas in the upper portion of the first chamber 127*b* is pushed toward peripheral regions of the first chamber 127*b*. Then, the gas is transferred downwardly through the vacant space 1234 of the piezoelectric actuator 123, and transferred through the central aperture 1220 of the resonance plate 122. From the above discussions, it can be seen that when the resonance plate 122 is vibrating along the vertical direction in the reciprocating manner, the gap g0 between the resonance plate 122 and the piezoelectric actuator 123 is helpful to increase the amplitude of vibration of the resonance plate 122. That is, the proper gap g0 between the resonance plate 122 and the piezoelectric actuator 123 allows the maximum amplitude of vibration of the resonance plate 122. Then, the resonance plate 122 is returned to the original position of FIG. 7A.

The processes of FIGS. 7A to 7D are repeatedly done. Consequently, the gas is continuously introduced into the convergence chamber 127*a* through the opening 1263 of the covering member 126, and transferred to the first chamber 127*b*. Then, the gas is transferred from the first chamber 127*b* to the convergence chamber 127*a*. Consequently, the gas can be transferred stably. When the air pump 12 is operated, the gas is sequentially transferred through the opening 1263 of the covering member 126, the convergence chamber 127*a*, the first chamber 127*b* and the convergence chamber 127*a*.

As mentioned above, after the air pump 12 is enabled, the gas is introduced into the air channel 13 through the pressure valve structure 15 and the gas is transferred to the buffer cushions 11*a*, 11*b* and the supporting cushions 11*c*, 11*d* through the air channel 13. Since the buffer cushions 11*a*, 11*b* and the supporting cushions 11*c*, 11*d* are inflated with the gas, the buffer cushions 11*a*, 11*b* are expanded to fit the shape of the ears of the user, and the supporting cushions 11*c*, 11*d* are also expanded to fit the shape of the bridge of the nose of the user. That is, the glasses 1 can be securely worn on the ears of the user, the position and the height of the main body 10 can be adjusted accordingly, so that the purpose of adjusting to the correct focusing position is reached, and also achieves the safe, comfortable and convenience purposes.

Figure 8:
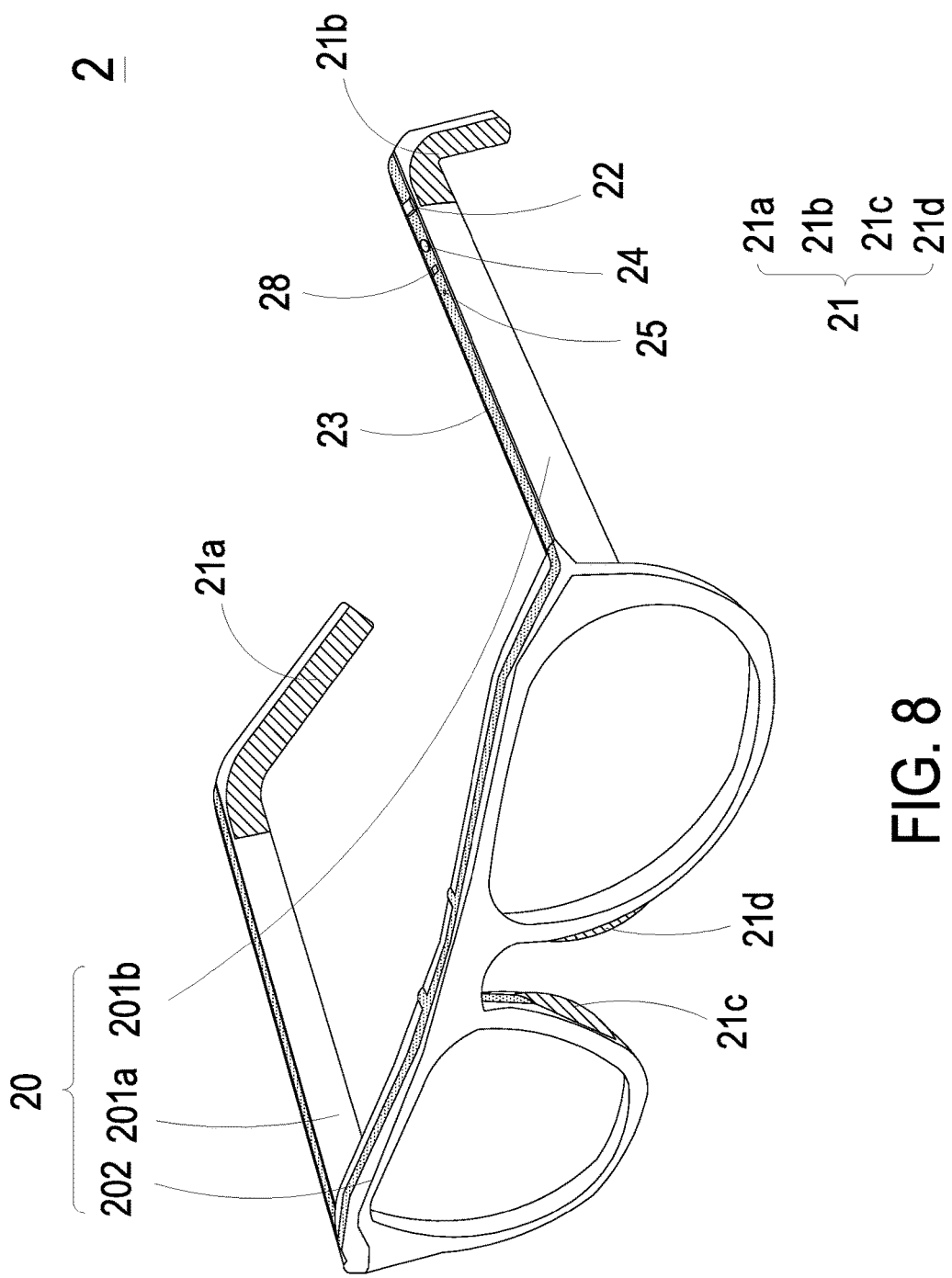
FIG. 8 is a schematic perspective view illustrating the outer appearance of a pair of glasses with a wearing cushion device according to a second embodiment of the present invention.

Please refer to FIG. 8. FIG. 8 is a schematic perspective view illustrating the outer appearance of a pair of glasses with a wearing cushion device according to a second embodiment of the present invention. As shown in FIG. 8, the glasses 2 comprise a main body 20, an inflatable cushion system 21, an air pump 22, an air channel 23 and a switch element 24, wherein the inflatable cushion system 21 includes two buffer cushions 21*a*, 21*b*, and two supporting cushions 21*c*, 21*d*. The main body 20 comprises two legs 201*a*, 201*b* and a frame 202. The two buffer cushions 21*a*, 21*b* are covered on a portion of a surface of the two legs 201*a*, 201*b*, respectively. The two supporting cushions 21*c*, 21*d* are disposed on the frame 202 and corresponding to the bridge of the nose, but not limited thereto. The switch element 24 is located at the leg 201*b*. In this embodiment, the air pump 22 and the air channel 23 are arranged on the main body 20, attaching to an external surface of the main body 20 and being exposed out of the main body 20. The glasses 2 also comprises a control unit (not shown), a pressure valve structure 25 and a gas pressure sensor 28, while the structures and the arrangement are similar to those of the first embodiment, and are not redundantly described herein.

When the user turns on the switch element 24, the switch element 24 issues an enabling signal to the control unit. In response to the enabling signal, the control unit enables the air pump 22 to transfer the gas into the buffer cushions 21*a*, 21*b* and the supporting cushions 21*c*, 21*d* through the air channel 23. Being inflated with the gas, the buffer cushions 21*a*, 21*b* and the supporting cushions 21*c*, 21*d* expand to fit the shape of the user's ears, face, and the bridge of the nose, so that the position and the height of the main body 10 are adjusted accordingly to be in the correct focusing position. In this embodiment, due to the exposed arrangement of the air pump 22 and the air channel 23, it is easier to detach and fix the components of the glasses 2, and the manufacturing process of the glasses 2 is simplified.

From the above descriptions, the present invention provides a pair of glasses with a wearing cushion device. The user can turn on the switch element to inflate the buffer cushions and the supporting buffer cushions with the gas. Consequently, the buffer cushions and the supporting buffer cushions are expanded until fitting closely to the bridge of the nose and the ears of the user, by which the buffer cushions and the supporting buffer cushions are adjustable according to the shapes of the bridge of the nose and the ears of the user so as to securely and comfortably fixed thereon. Since the possibility of falling down the glasses is minimized, the safety of using the glasses is increased. Moreover, the glasses have the gas pressure adjusting function, using the gas pressure sensor to detect the gas pressure within the buffer cushions and the supporting buffer cushions and using the control unit to control the gas pressure to be in a specified range. Since the buffer cushions and the supporting buffer cushions are controlled and not excessively expanded, the pressure applied to the user's ears is comfortable. In addition, the user can turn off the switch element to reduce the pressure or deflate the buffer cushions and the supporting buffer cushions when the glasses are in the non-usage state. Under this circumstance, the use lives of the buffer cushions and the supporting buffer cushions are extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pair of glasses with a wearing cushion device, the glasses comprising:
   a main body comprising a frame and two legs;
   an inflatable cushion system comprising:
      two supporting cushions disposed on the frame of the main body and corresponding to the bridge of the nose; and
      two buffer cushions respectively disposed on the two legs;
   an air pump;
   a switch element;
   a control unit electrically connected with the switch element and the air pump; and
   an air channel in communication with the two supporting cushions, the two buffer cushions and the air pump,
   wherein when the switch element is turned on, the switch element issues an enabling signal to the control unit and the control unit enables the air pump in response to the enabling signal, wherein when the air pump is enabled, an ambient gas is transferred to the two supporting cushions and the two buffer cushions through the air channel, by which the two supporting cushions and the two buffer cushions are inflated with the gas and expanded, so as to fit closely on the ears of the user by the two buffer cushions and fit closely on the bridge of the nose of the user by the two supporting cushions, and the position of the main body are adjusted.

2. The glasses according to claim 1, wherein the supporting cushions are made of a compressible elastic material, which can be expanded or compact.

3. The glasses according to claim 1, wherein the buffer cushions are made of a compressible elastic material, which can be expanded or compact.

4. The glasses according to claim 1, wherein the glasses further comprise a gas pressure sensor electrically connected with the control unit, wherein if the gas pressure sensor detects a pressure of the gas within the air channel higher than a threshold value, the gas pressure sensor issues a disabling signal to the control unit, wherein in response to the disabling signal, the control unit disables the air pump.

5. The glasses according to claim 1, wherein the glasses further comprise a pressure valve structure in communication with the air channel, the pressure valve structure is a switchable valve structure comprising a check valve and a relief valve, the check valve allows the gas in the air channel to flow in only one direction without backflow, and the relief valve adjusts a pressure of the gas in the air channel.

6. The glasses according to claim 5, wherein the pressure valve structure is electrically connected with the control unit, wherein when the air pump is enabled by the control unit in response to the enabling signal, the gas in the air channel is transferred in one direction by the check valve of the pressure valve structure.

7. The glasses according to claim 5, wherein the pressure valve structure is electrically connected with the control unit, wherein when the switch element is turned off, the switch element issues a pressure-relief signal to the control unit, the control unit controls the relief valve of the pressure valve structure to decrease the pressure in response to the pressure-relief signal by discharging the gas from the inflatable cushion system to surroundings of the glasses through the air channel, the relief valve of the pressure valve structure and an exhaust hole of the main body, so that the pressure in the air channel is adjusted or the inflatable cushion system is restored to a deflated state.

8. The glasses according to claim 1, wherein the air pump is a piezoelectric air pump.

9. The glasses according to claim 8, wherein the piezoelectric air pump comprises:
   a resonance plate having a central aperture and a movable part around the central aperture;
   a piezoelectric actuator aligned with the resonance plate; and
   a covering member comprising a sidewall, a bottom plate and an opening, wherein the sidewall is protruded from edges of the bottom plate, an accommodation space is defined by the sidewall and the bottom plate collaboratively, the resonance plate and the piezoelectric actuator are accommodated within the accommodation space, and the opening is formed in the sidewall,
   wherein a gap is formed between the resonance plate and the piezoelectric actuator to define a first chamber, wherein when the piezoelectric actuator is actuated, the gas is fed into the opening of the covering member and transferred to the first chamber through the central aperture of the resonance plate, and the gas is transferred according to a resonance effect between the piezoelectric actuator and the movable part of the resonance plate.

10. The glasses according to claim 9, wherein the piezoelectric actuator comprises:
    a suspension plate having a first surface and a second surface, wherein the suspension plate is permitted to undergo a curvy vibration;
    an outer frame arranged around the suspension plate;
    at least one bracket connected between the suspension plate and the outer frame for elastically supporting the suspension plate; and
    a piezoelectric element, wherein a length of a side of the piezoelectric element is smaller than or equal to a length of a side of the suspension plate, and the piezoelectric element is attached on the second surface of the suspension plate, wherein when a voltage is applied to the piezoelectric element, the suspension plate is driven to undergo the curvy vibration.

11. The glasses according to claim 10, wherein the suspension plate is a square suspension plate with a bulge.

12. The glasses according to claim 10, wherein the piezoelectric air pump further comprises a conducting plate, a first insulation plate and a second insulation plate, wherein the resonance plate, the piezoelectric actuator, the first insulation plate, the conducting plate, the second insulation plate and the covering member are stacked on each other sequentially.

13. The glasses according to claim 1 further comprising a battery, wherein the battery provides electric power for powering the control unit.

14. The glasses according to claim 1, wherein the air channel and the air pump are embedded in the main body.

15. The glasses according to claim 1, wherein the air channel and the air pump are attached on the main body.

* * * * *